(12) United States Patent  (10) Patent No.: US 8,541,680 B2
Eberspacher et al.  (45) Date of Patent: Sep. 24, 2013

(54) PHOTOVOLTAIC CELLS INCLUDING PEAKS AND METHODS OF MANUFACTURE

(75) Inventors: Chris Eberspacher, Palo Alto, CA (US); Bruce E. Adams, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 533 days.

(21) Appl. No.: 12/792,707

(22) Filed: Jun. 2, 2010

(65) Prior Publication Data

US 2011/0023957 A1  Feb. 3, 2011

Related U.S. Application Data

(63) Continuation-in-part of application No. 12/628,451, filed on Dec. 1, 2009.

(60) Provisional application No. 61/119,426, filed on Dec. 3, 2008.

(51) Int. Cl.
  *H01L 31/00*  (2006.01)
(52) U.S. Cl.
  USPC ........................................................ 136/256
(58) Field of Classification Search
  USPC .................................................. 136/256, 255
  See application file for complete search history.

(56) References Cited

U.S. PATENT DOCUMENTS

| 5,922,142 | A | 7/1999 | Wu et al. |
| 6,524,880 | B2 | 2/2003 | Moon et al. |
| 6,632,116 | B2 | 10/2003 | Watanabe et al. |
| 2002/0148721 | A1 | 10/2002 | Lindquist et al. |
| 2005/0000561 | A1 | 1/2005 | Baret et al. |
| 2006/0196536 | A1* | 9/2006 | Fujioka et al. ............. 136/244 |
| 2007/0131271 | A1 | 6/2007 | Lim et al. |
| 2007/0193624 | A1* | 8/2007 | Krasnov ..................... 136/258 |
| 2008/0289681 | A1 | 11/2008 | Adriani et al. |
| 2009/0194163 | A1 | 8/2009 | Sivaram et al. |
| 2010/0065104 | A1 | 3/2010 | Baruh |
| 2010/0288350 | A1* | 11/2010 | Lee et al. ................... 136/256 |
| 2011/0023957 | A1 | 2/2011 | Eberspacher et al. |

FOREIGN PATENT DOCUMENTS

| JP | 2007-017601 A | 1/2007 |
| JP | 2007-307539 A | 11/2007 |
| KR | 10-0785730 B1 | 12/2007 |

OTHER PUBLICATIONS

PCT ISR & Wo in PCT/US2011/038853, mailed Dec. 7, 2011, 8 pgs.
"Non-Final Office Action in U.S. Appl. No. 12/628,451", mailed Mar. 2, 2012, 18 pages.
"PCT Search Report", PCT/US2009/066395, Jul. 6, 2010, 3 pgs.
"PCT Written Opinion", PCT/US2009/066395, Jul. 6, 2010, 3 pgs.
Dunsky, Corey M. et al., "Scribing thin-film solar panels", http://www.industrial-lasers.com/articles/print Feb. 2008, 3 pgs.

* cited by examiner

*Primary Examiner* — Eli Mekhlin
(74) *Attorney, Agent, or Firm* — Servilla Whitney LLC

(57) ABSTRACT

Photovoltaic module and methods for the manufacture of photovoltaic modules are described. Operative layers of the photovoltaic cell are deposited onto a superstrate having one or more of at least one peak allowing for electrical isolation of a portion of a photovoltaic module and at least one ramp creating a series connection between individual photovoltaic cells with minimal loss of the efficiency due to dead space between the cells.

10 Claims, 8 Drawing Sheets

PHOTOVOLTAIC CELLS INCLUDING PEAKS AND METHODS OF MANUFACTURE

CROSS-REFERENCE TO RELATED APPLICATION

This application is a continuation-in-part under 35 U.S.C. §120 of U.S. patent application Ser. No. 12/628,451, filed Dec. 1, 2009, which claims priority under 25 U.S.C. 119(e) to U.S. Provisional Application No. 61/119,426, filed Dec. 3, 2008, which is hereby incorporated by reference in its entirety.

BACKGROUND

Embodiments of the present invention generally relate to photovoltaic cells and methods for making photovoltaic cells. Specific embodiments pertain to photovoltaic cells and methods of making photovoltaic cells having a substantially minimized dead zone.

Thin-film photovoltaic devices are typically fabricated as monolithic integrated modules where multiple solar cells are monolithically interconnected by way of a series of patterns and depositions. These patterns are typically effected by laser or mechanical scribing using expensive, high precision patterning tools that add cost and complexity to the photovoltaic device manufacturing.

A typical manufacturing process for solar cells is shown in FIG. 1. Starting at 100, solar cells are manufactured by starting with a glass sheet or substrate 114. An exemplary thickness for the glass sheet is about 3 mm. In the art, this glass substrate is typically called a glass superstrate because sunlight will enter through this support glass. During the manufacture of a solar cell, shown in step 102, a continuous, uniform front contact layer 116, typically including a transparent conductive oxide (TCO) is deposited on the glass substrate 114. The thickness of the front contact layer 116 is typically a few hundred nanometers. The front contact layer 116 eventually forms the front electrodes of the solar cell. Suitable materials for the front contact layer 116 include, but are not limited to, aluminum-doped zinc oxide (AZO), indium tin oxide (ITO), indium molybdenum oxide (IMO), indium zinc oxide (IZO) and tantalum oxide. The front contact layer 116 can be deposited by any suitable process, such as chemical vapor deposition (CVD).

In step 104, after the deposition of the front contact layer 116, a laser scribing process, which is often referred to as P1, scribes strips 118 through the entire thickness of the front contact layer 116. The scribed strips are usually 5-10 mm apart. After the scribing process P1, a p- and n-type silicon layer 120 is deposited over the front contact layer 116, as shown in step 106. The total thickness of the silicon layer 120 is typically on the order of 2-3 μm, and this layer is usually deposited by chemical vapor deposition or other suitable processes.

Referring to step 108, the silicon deposition step is followed by a second laser scribing step, often referred to as P2, which completely cuts strips 122 through the silicon layer 120. As shown in step 110, a back contact layer 124, which often includes one or more of a TCO layer and a metal layer that forms the rear electrode is deposited over the silicon layer 120. The back contact layer 124 can be deposited by any suitable deposition process, such as physical vapor deposition (PVD). Referring now to step 112, a third scribing process, called P3, is used to scribe strips 126 through the back contact layer 124 and the silicon layer 120. The panel is then typically sealed with a rear surface glass lamination (not shown). The area between, and including, the P1 and P3 scribes results in a dead zone 128 which decreases the overall efficiency of the cell. The dead zone is typically in the range of about 100 μm to about 500 μm, depending on the accuracy of the lasers and optics employed in the scribing processes.

Therefore, there is a need to provide methods to improve the efficiency and ease of manufacturing photovoltaic cells.

SUMMARY OF THE INVENTION

A first aspect of the invention pertains to a photovoltaic module. In one embodiment, a photovoltaic module comprises a superstrate having a front side, a back side, a left edge and a right edge, the back side having a roughened surface including at least one peak; a front contact layer on the back side of the superstrate; a layer of amorphous silicon overlying the front contact layer; and a back contact layer overlying the silicon layer, the back contact layer having a front side facing the silicon layer and a back side, wherein the at least one peak and the layers thereon are truncated, exposing a portion of the superstrate and interrupting continuity of the layers. In one embodiment, the at least one peak is located near either the left edge or right edge of the superstrate. In an embodiment, there is at least one peak located near the left edge of the superstrate and a plurality of peaks located near the right edge of the superstrate, each peak being truncated, exposing a portion of the superstrate. In at least one embodiment, the at least one peak located near the left edge defines a left edge delete zone of the photovoltaic module, and the plurality of peaks located near the right edge defines a right edge delete zone of the photovoltaic module. In one embodiment, the module further comprises at least one ramp including a ramped surface and a vertical face which is substantially perpendicular to the back side of the superstrate, the ramp having a height effective to form a connection between the front contact layer located at the top of the ramp with the back contact layer located adjacent the top of the ramp on the vertical face side. In one embodiment, the module comprises a reflective layer on the back contact layer, a polymer laminate layer on the reflective layer and a glass back on the polymer laminate layer. In at least one embodiment, there are a plurality of spaced ramps separated by a distance in the range of about 5 mm to about 10 mm. In at least one embodiment, the at least one spaced ramp extends outwardly from the back side of the superstrate up to a height of about 5 microns.

In one embodiment, the superstrate is about 3 mm thick. In one or more embodiments, the superstrate is glass or plastic A second aspect of the invention pertains to a method of making a photovoltaic module. In one embodiment, the method comprises providing a superstrate having a front side, a back side, a left edge and a right edge, the back side having a roughened surface including at least one peak; depositing a front contact layer onto the back side of the superstrate such that the deposited front contact layer covers the at least one peak of the roughened surface; depositing a silicon layer on the front contact layer; depositing a back contact layer on the silicon layer; and removing at least a portion of the at least one peak to create a truncated peak and a flattened surface, the truncated peak having a portion of superstrate exposed therethrough. In one embodiment, the method further comprises applying a reflective layer to the flattened surface, a polymer lamination layer over the reflective layer followed by a layer of glass. In one method embodiment, one or more of the front contact layer and the back contact layer includes a transparent conductive oxide.

In one method embodiment, one or more of the front contact layer, the back contact layer and the silicon layer are deposited by physical vapor deposition. In one method embodiment, the superstrate further comprises a plurality of spaced ramps including ramped surfaces and vertical faces which are substantially perpendicular to the back side of the superstrate. In one method embodiment, the spaced ramps are separated so that there is a region of flat superstrate between each spaced ramp.

In one method embodiment, the front contact layer is deposited on an angle such that the vertical faces of the spaced ramps are shielded by the ramped surfaces. In one embodiment, the method further comprises cleaning the vertical face of the spaced ramps after deposition of the front contact layer by laser ablation performed at a grazing angle to hit substantially only the vertical surfaces. In one embodiment, the superstrate is glass or plastic, and the roughened surface is formed on the superstrate by one or more of intaglio, rotogravure, etching, engraving, relief printing and lithography.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Figure 1:
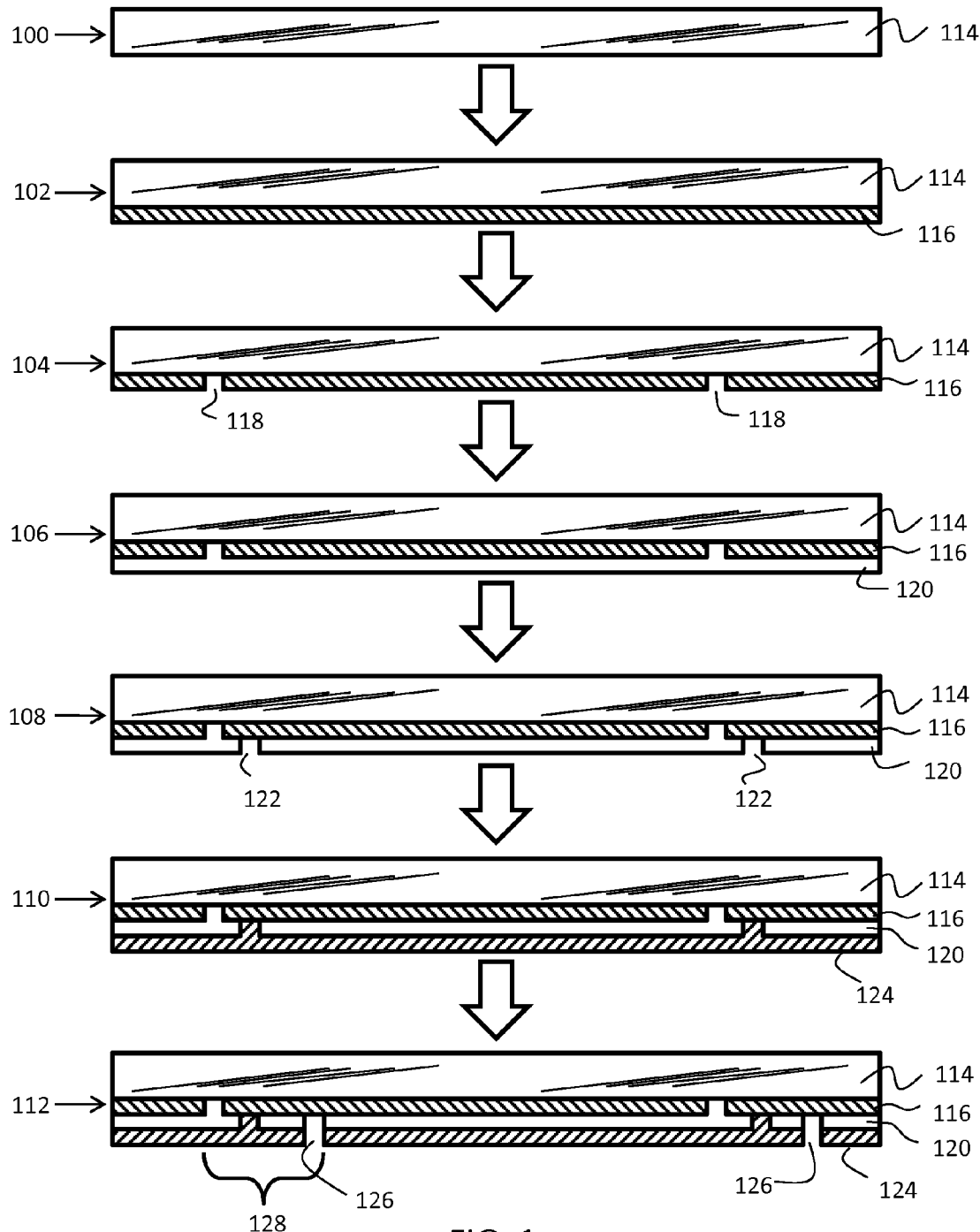
FIG. 1 shows steps for making photovoltaic cells using a laser scribing technique according to the prior art.
Figure 2:
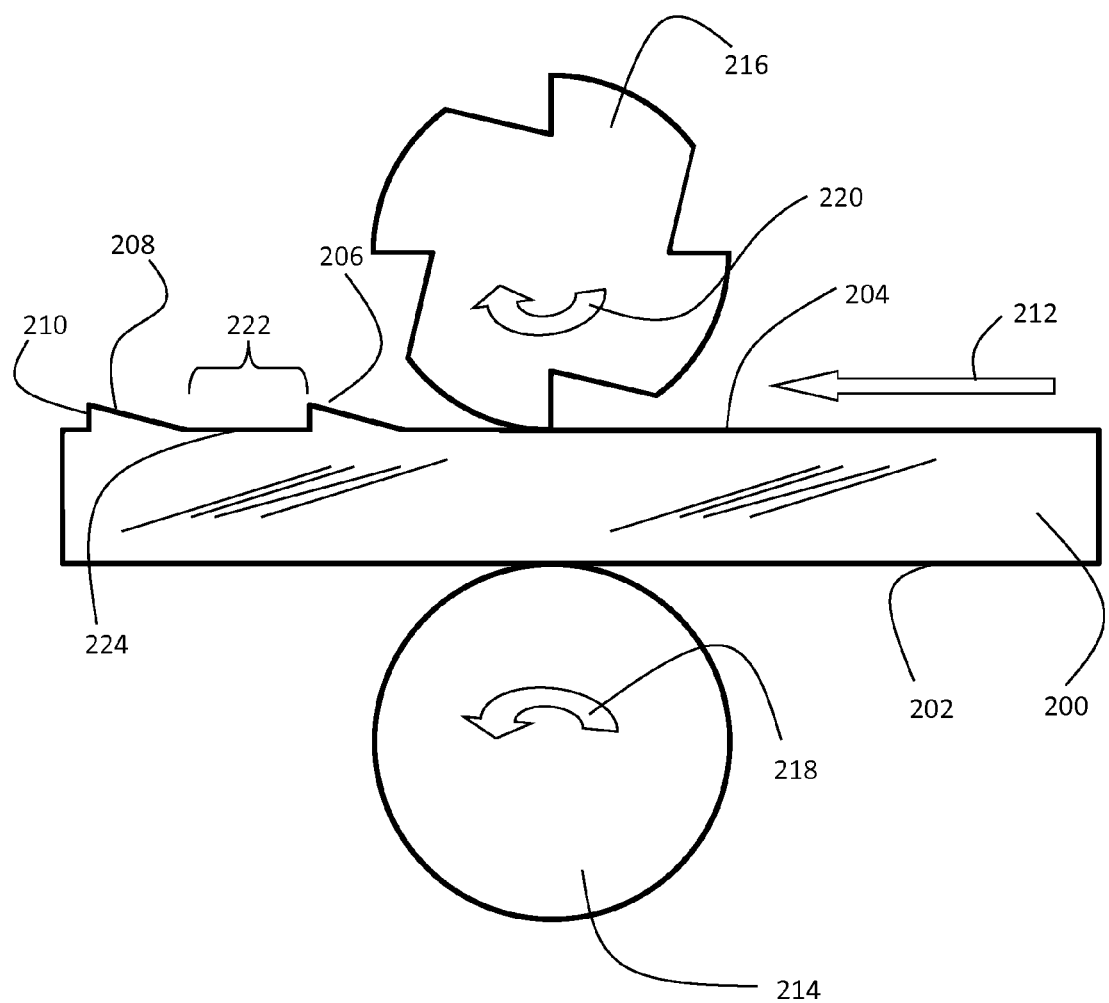
FIG. 2 shows a superstrate being patterned with spaced ramps by a rotogravure-type process in accordance with one embodiment of the invention.

One or more embodiments of the invention are directed to photovoltaic cells and methods of making photovoltaic cells. With reference to FIG. 2, a superstrate 200 is provided which has a front side 202, a back side 204, a left edge 230 and a right edge 232. A series of spaced ramps 206 are provided on the back side 204 of the superstrate 200. The spaced ramps 206 include ramped surfaces 208 and vertical faces 210 which are substantially perpendicular to the back side 204 of the superstrate 200. The spaced ramps 206 extend through any material layers applied to the back side 204 of the superstrate 200. The spaced ramps 206 extend outwardly from the surface of the back side 204 of the substrate 200 to a height of less than about 10 μm. In detailed aspects, the spaced ramps 206 extend from the superstrate 200 backside 204 to a height of about 5 μm.

The spaced ramps 206 can be formed by any suitable technique. Non-limiting examples of suitable techniques include intaglio, rotogravure, etching, engraving, relief printing and lithography. The spaced ramps of one or more embodiments is created by one or more of mechanical techniques, chemical or laser texturing, or a rough surface formed by deposited materials including inks and pastes. FIG. 2 shows a rotogravure type process where the superstrate 200, moving from right to left 212, passes between a flat roller 214 and a patterned roller 216. The flat roller 214 is shown rotating in a counter-clockwise direction 218 and the patterned roller 216 rotates in a clockwise direction 220 causing the superstrate 200 to move in the desired direction 212. While the process shown in FIG. 2 has the superstrate moving from right to left, this should not be interpreted as a limitation on the direction of superstrate movement. In one or more embodiments, the spaced ramps may be formed in the superstrate during formation of the superstrate when the glass or plastic sheet material is in a softened state, for example, while the glass or plastic sheet is being formed during a sheet formation operation such as drawing the sheet from a furnace or lehr. Alternatively, a flat glass or plastic sheet may be heated to soften at least the surface so that the spaced ramps can be formed on the sheet. It will be appreciated that for certain materials and processes such as etching, heating may not be required to form the ramps.

The spacing 222 between the spaced ramps 206 can be changed according to the desired size of the resulting solar cells. The spacing 222 is generally less than about 20 mm. Detailed aspects of the invention have the spacing 222 between the spaced ramps 206 of less than about 10 mm. More detailed aspects have the spacing 222 between about 5 and about 10 mm. Other detailed aspects have no spacing 222 between the spaced ramps 206. Where there is a space between the ramps 206, the space 222 may be a substantially flat region 224 on the superstrate 200.

The superstrate 200 can be any suitable material, for example, glass or plastic, and can be any thickness as desired by the intended application. Detailed aspects of the invention include a superstrate which is less than about 5 mm thick. According to other detailed aspects, the superstrate is about 3 mm thick.

Figure 3:
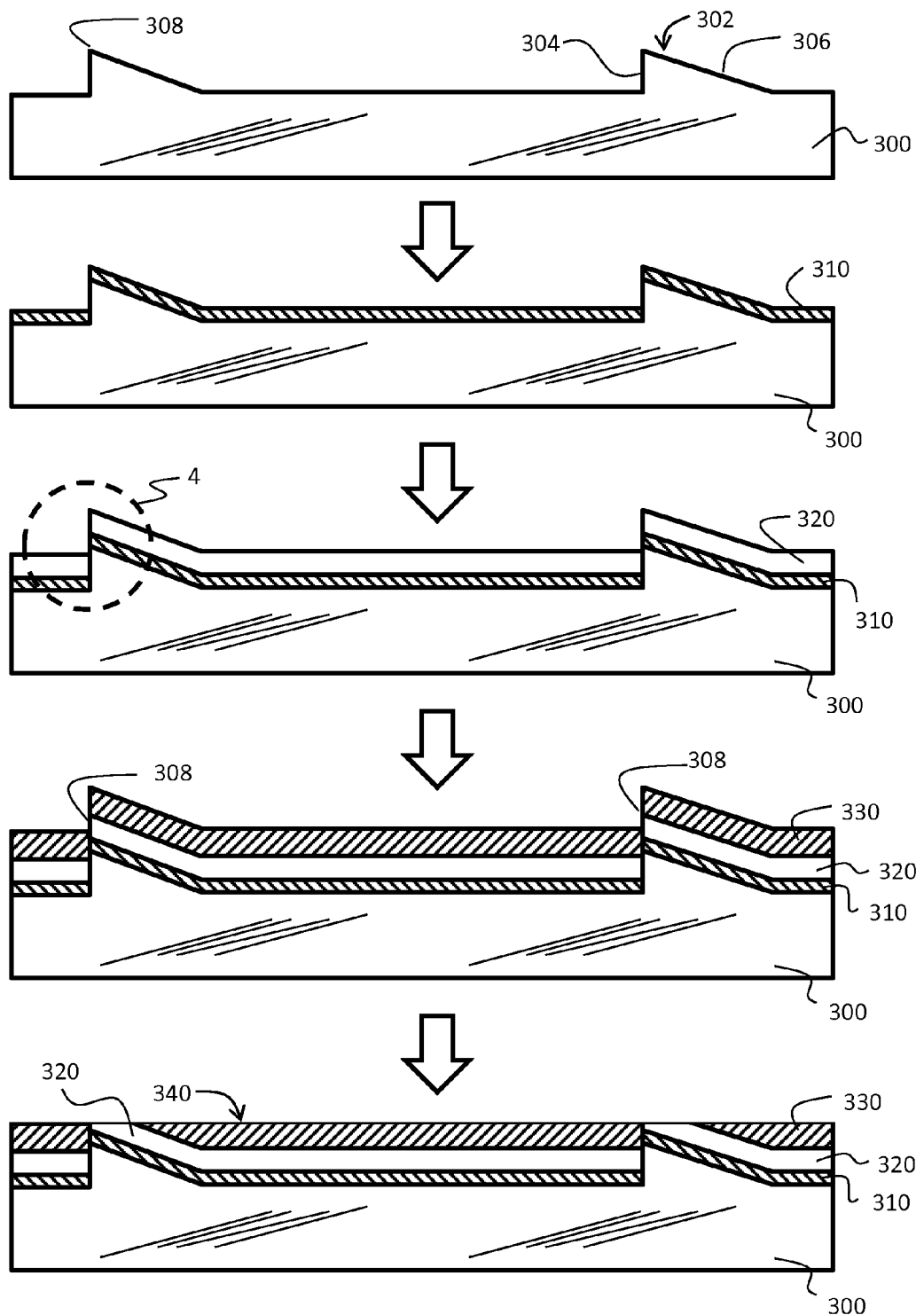
FIG. 3 shows steps for making photovoltaic cells using a superstrate having spaced ramps according to an embodiment of the invention.

FIG. 3 shows steps for preparing a photovoltaic cell according to one or more embodiments of the invention. A superstrate 300 is prepared having spaced ramps 302 with vertical faces 304, as previously described. Descriptions of FIGS. 3-5 refer to the first layer (reference numerals 310 and 520) on the superstrate as the TCO layer. It should be understood that these layers create the front contact of the solar cell and does not necessarily require a transparent conductive oxide. Description of FIGS. 3-5 also refer to the third layer (reference numerals 330 and 550) on the superstrate as the metal layer. It should be understood that these layers create the back contact of the solar cell and do not necessarily require metal layer. Additionally, the back contact layer often contains a combination of layers which can include both a transparent conductive oxide layer and a reflective metal layer.

A transparent conductive oxide (TCO) layer 310 is deposited onto the back side of the superstrate 300. Suitable TCOs are known to those skilled in the art. Non-limiting examples of transparent conductive oxides include aluminum-doped zinc oxide (AZO), indium tin oxide (ITO), indium molybdenum oxide (IMO), indium zinc oxide (IZO) and tantalum oxide. The TCO layer 310 is deposited in a manner such that substantially none of the TCO coats the vertical faces 304 of the spaced ramps 302. The spaced ramps 302 on the superstrate 300 extend through the TCO layer 310.

The TCO layer 310 can be deposited by any suitable means, as would be known to those skilled in the art. Detailed aspects of the invention have the TCO layer 310 deposited by physical vapor deposition. In other aspects, the TCO layer 310 is deposited on an angle toward the ramped surfaces 306 of the spaced ramps 302. By depositing the TCO on an angle, the vertical faces 304 of the spaced ramps 302 are partially shielded, resulting in a decreased likelihood that the TCO will coat the vertical faces 304.

According to some detailed aspects, the TCO layer 310 is up to about 500 nm thick. In other detailed aspects, the TCO layer 310 is about 300 nm thick.

In some detailed embodiments, laser ablation or other suitable techniques are used to clean the vertical faces 304 of the spaced ramps 302 after the TCO layer 310 has been deposited. The laser ablation cleaning may be done by directing the laser at the TCO coated superstrate 300 on a grazing angle so that the laser hits substantially only the vertical faces 304 of the spaced ramps 306.

Figure 4:
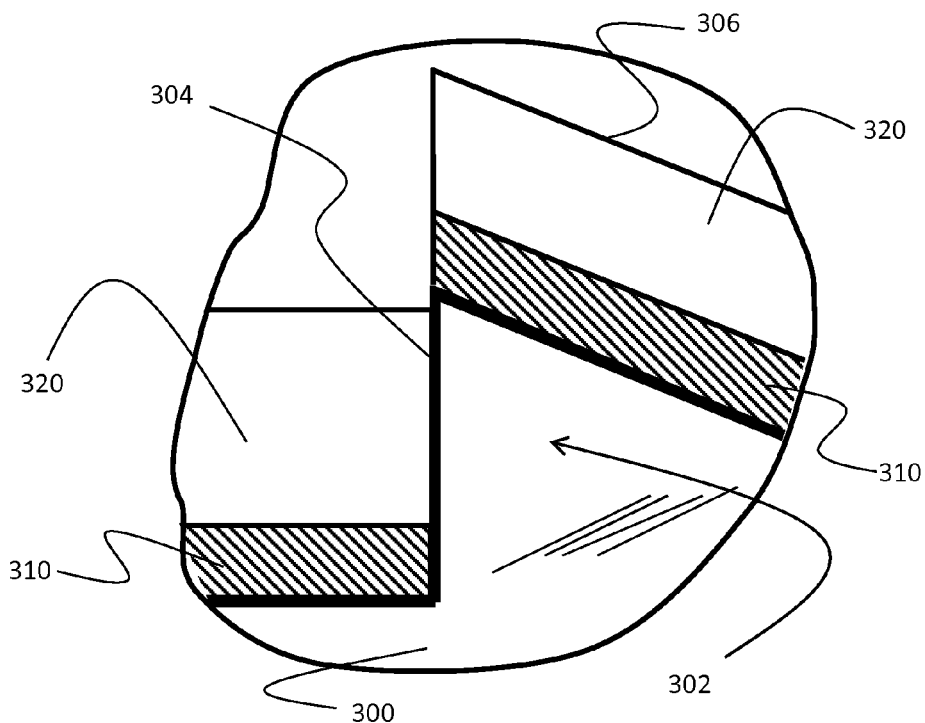
FIG. 4 shows an enlarged view of the top of the spaced ramps, including a transparent conductive oxide layer and a silicon layer.

After depositing the TCO layer 310, a silicon layer 320 is deposited on the transparent conductive oxide layer 310. The silicon layer 320 is deposited between the spaced ramps 302 in a manner such that the silicon layer 320 does not contact the transparent conductive oxide layer 310 on top on the ramped surfaces 306. For instance, the silicon layer 320 does not extend substantially above the peak 308 of the vertical face 304 of the spaced ramps 302. The thickness of the silicon layer 320 is slightly smaller than the height of the individual spaced ramps 302, which is typically about 2 to 3 μm. FIG. 4 shows an expanded view of area 4 in FIG. 3, showing the top region of one of the spaced ramps 302 with the TCO layer 310 and silicon layer 320 deposited thereon. The spaced ramps 302 on the superstrate 300 extend through the TCO layer 310 and the silicon layer 320. The silicon layer 320 can be deposited by any suitable methods. Detailed aspects of the invention have the silicon layer 320 deposited by chemical vapor deposition.

After deposition of the silicon layer 320, a metal layer 330 is deposited on the silicon layer 320. The spaced ramps 302 of the superstrate 300 extend through the TCO layer 310, the silicon layer 320 and the metal layer 330, resulting in a plurality of peaks 308 projecting through the metal layer 330. The metal layer of some aspects is less than about 2 μm thick. In other detailed aspects, the metal layer is less than about 1 μm thick. Suitable metals for use with photovoltaic cells are known to those skilled in the art. Non-limiting examples include aluminum, molybdenum and combinations thereof.

After deposition of the metal layer 330, at least a portion of the peaks 308 extending from the superstrate 300 through the TCO layer 310, the silicon layer 320 and the metal layer 330 are removed as shown in the last step of FIG. 3. Removal of these protruding peaks 308 results in a substantially flat back surface 340 with portions of the silicon layer 320 being exposed. Methods and techniques for removal of the protruding peaks are known to those skilled in the art. Suitable methods include, but are not limited to, buffing, grinding and cutting.

Figure 5:
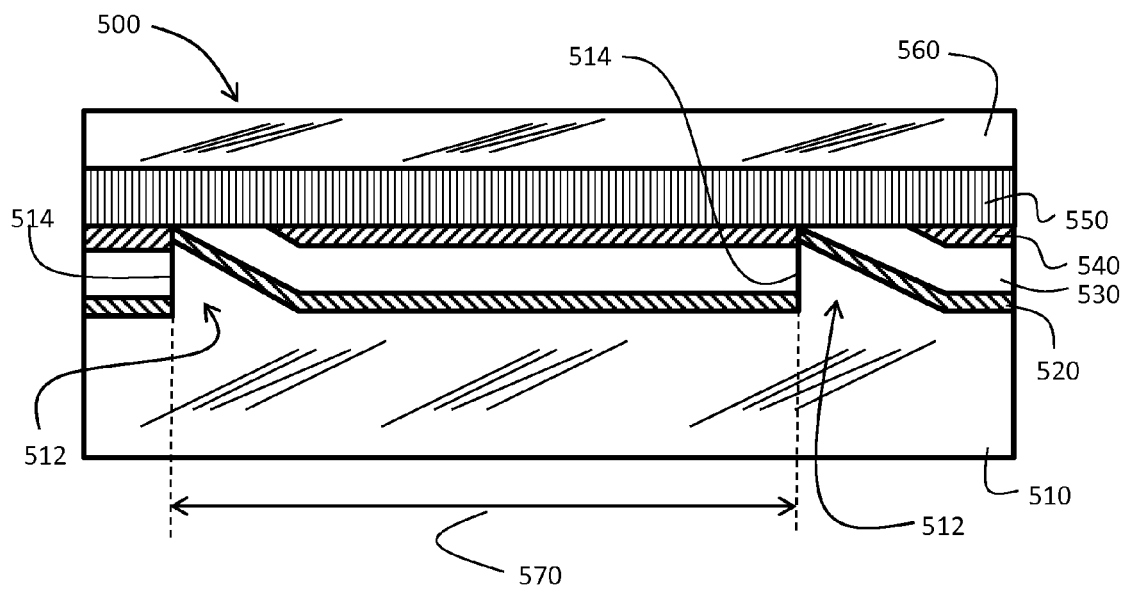
FIG. 5 shows a photovoltaic cell prepared using a patterned superstrate according to one or more embodiments of the invention.

FIG. 5 shows a photovoltaic cell 500 made according to one or more embodiments of the described methods. The photovoltaic cell 500 comprises a superstrate 510 having spaced ramps 512 thereon. The photovoltaic cell 500 is not drawn to scale, the height of the spaced ramps 512 being exaggerated for illustrative purposes. A transparent conductive oxide layer 520 is deposited on the superstrate 510. A silicon layer 530 is deposited on the TCO layer 520, and a metal layer 540 is deposited on the silicon layer 530. The back side of the metal layer 540 is shown after it has been smoothed. A polymer lamination layer 550 may be applied followed by a layer of glass 560, or other suitable material.

The resultant photovoltaic cell 500 is a collection of a plurality of individual photovoltaic cells 570 attached in series. The individual photovoltaic cells 570 extend from the vertical face 514 of one spaced ramp 512 to the vertical face 514 of the adjacent spaced ramp 512. The individual photovoltaic cells 570 are connected to the adjacent cells by a series connection. That is, the TCO layer 520 of one cell 570 connects to the metal layer 540 of the adjacent cell 570.

In some embodiments, the metal layer 540 includes a second TCO layer adjacent the silicon layer 530. The metal layer 540 can act as a reflective layer on a back contact layer. A polymer lamination layer 550 may be applied over the second TCO layer/reflective metal layer and a glass back 560 can be applied to the polymer lamination layer 550.

In the conventional process, what may be referred to as a "dead zone" results between the P1 and P3 laser scribed gaps between individual photovoltaic cells. These dead zones are typically on the order of 100 to 500 μm. The dead zone resulting from the methods and photovoltaic cells described herein is smaller than about 100 microns. The dead zone of specific aspects is less than about 75 μm. The dead zone or other specific aspects is less than about 50 μm. This decrease in the size of the dead zone may result in significantly less waste in the resultant photovoltaic cells.

Additional embodiments of the invention are directed to photovoltaic modules using a superstrate with a roughened surface with a plurality of peaks to facilitate patterning of deposited coatings of typical thin-film solar cells, namely the "P1", "P2" and "P3" patterning and the "edge delete" patterns in the perimeter region. As with the spaced ramps previously described, the plurality of peaks can be formed by any suitable technique. Non-limiting examples of suitable techniques include intaglio, rotogravure, etching, engraving, relief printing and lithography. The spaced ramps of one or more embodiments are created by one or more of mechanical techniques, chemical or laser texturing, or a rough surface formed by deposited materials including inks and pastes. The features that facilitate patterning include a rough surface which can be formed by mechanical, chemical or laser texturing, a rough surface formed by deposited materials including inks and pastes, or an abrupt topology change (e.g. where the substantially abrupt vertical change is substantially greater than the thickness of the critical PV coatings). In specific embodiments, the roughened surface is on a printed and fired glass frit. As used herein, the term "peak" refers to the highest point on the surface of the superstrate. As will be appreciated, the peak may include the highest vertical portion of the ramps described above. Alternatively, as described further below, the peak may refer to the highest portion of the changed topology or raised portion of the superstrate, which may be before or after truncation of a portion of the raised surface or peak as described further below.

Figure 6:
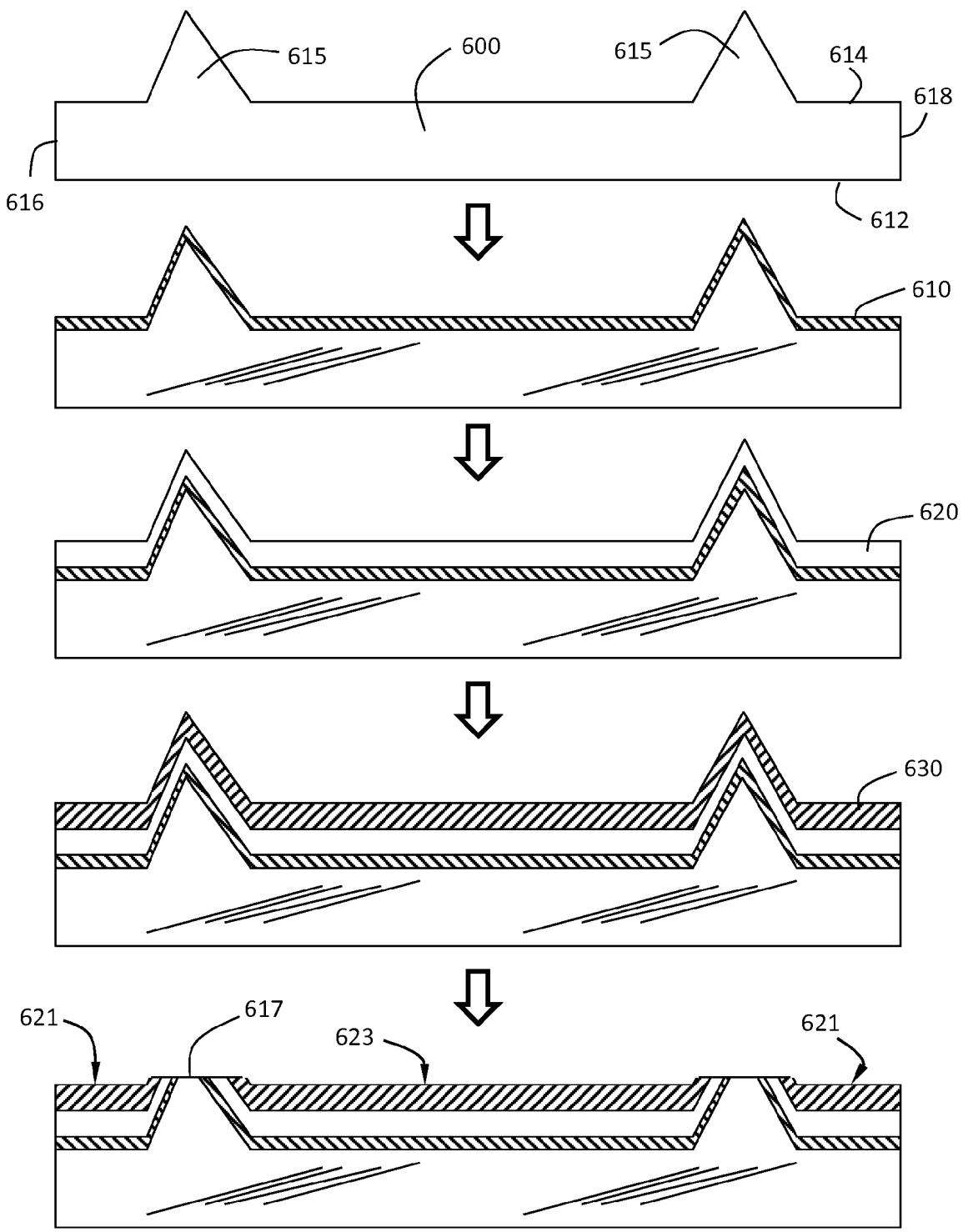
FIG. 6 shows a photovoltaic cell prepared using topology changes in accordance with one or more embodiments of the invention.

FIG. 6 shows cross-sectional views of a solar module manufacturing process according to various embodiments of the invention. A superstrate 600 is provided having a front side 612, back side 614, left edge 616 and right edge 618. The back side 614 of the superstrate 600 has a roughened surface. This roughened surface includes at least one peak 615. A front contact layer 610 is deposited onto the back side 614 of the superstrate 600 such that the deposited front contact layer 610 covers the at least one peak 615. A silicon layer 620 is deposited over the front contact layer 610 and a back contact layer 630 is deposited over the silicon layer 620. Each of these layers is built up conserving the features of the roughened surface of the superstrate.

At least a portion of the at least one peak 615 is removed to create a truncated peak 617. The truncated peak 617 has a portion of superstrate 600 exposed therethrough. The process of creating the truncated peak 617 interrupts the continuity of the layers and provides electrical discontinuity across the photovoltaic module.

The detailed embodiment shown in FIG. 6 has two peaks 615 with one located near the left edge 616 and the other near the right edge 618. After truncation of these peaks (as shown in the last drawing) three regions are created. The edge regions 621 are electrically isolated from the central region 623. This process can be used, for example, to create the edge delete region of a photovoltaic module, with the edge regions 621 representing the edge deleted area and the central region 623 being the electricity generating region. In one or more specific embodiments, one or more of the front contact layer 610 and the back contact layer 630 includes a transparent conductive oxide.

Figure 7:
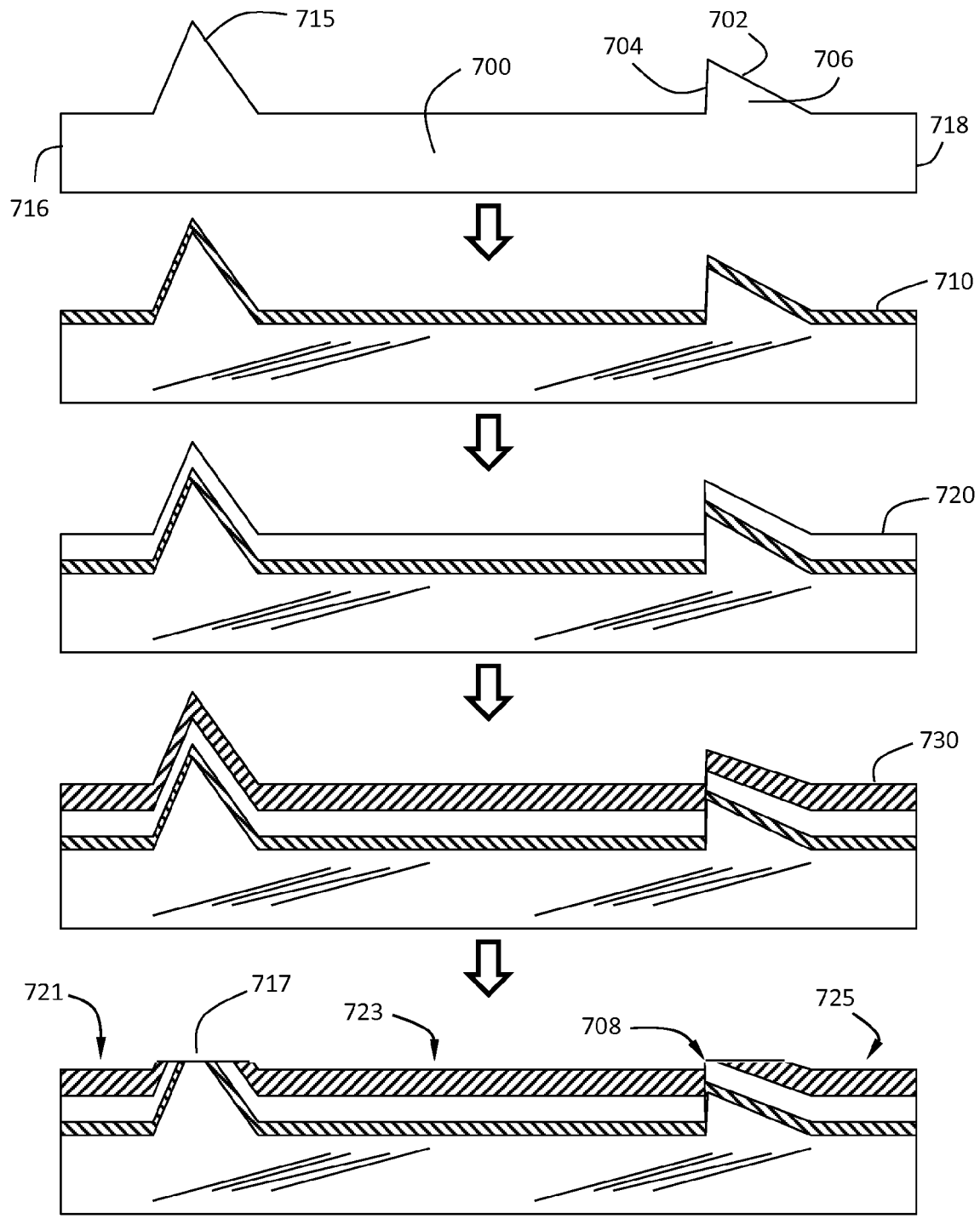
FIG. 7 shows a photovoltaic cell preparation using spaced ramps and topology changes in accordance with one or more embodiments of the invention.

FIG. 7 shows another embodiment of the invention which incorporates a superstrate 700 having at least one peak 715 located near a left edge 716 of the superstrate 700 and at least one ramp 706. The at least one ramp 706 includes a ramped surface 702 and a vertical face 704 which is substantially perpendicular to the back side 714 of the superstrate 700. As described earlier, the at least one ramp 706 has a height which is effective to form a connection between the front contact layer 710 located at the top of the ramped surface 702 with the back contact layer 730 located adjacent 708 the top of the ramped surface 702 through the silicon layer 720.

Removing the top of the at least one peak 715 results in a truncated peak 717 with an area of superstrate 700 exposed. This creates an electrical discontinuity in the photovoltaic module. As shown in the embodiment of FIG. 7, creation of the truncated peak 717 creates an electrically isolated edge region 721 and an electricity generating region 723. Although not shown in FIG. 7 it should be understood that at least another peak could be located near the right edge 718 of the superstrate 700. Such a configuration would result in a second edge delete area on the right edge of the module.

The height of the at least one peak 705, as shown in FIG. 7, is greater than the height of the at least one ramp 706. Upon truncation, the superstrate 700 is not exposed at the at least one ramp 706 as is seen at the at least one peak 717. Electrical connectivity at the at least one ramp 706 forms a series connection between the cell to the left of the ramp 706 and the cell to the right of the ramp 706.

Figure 8:
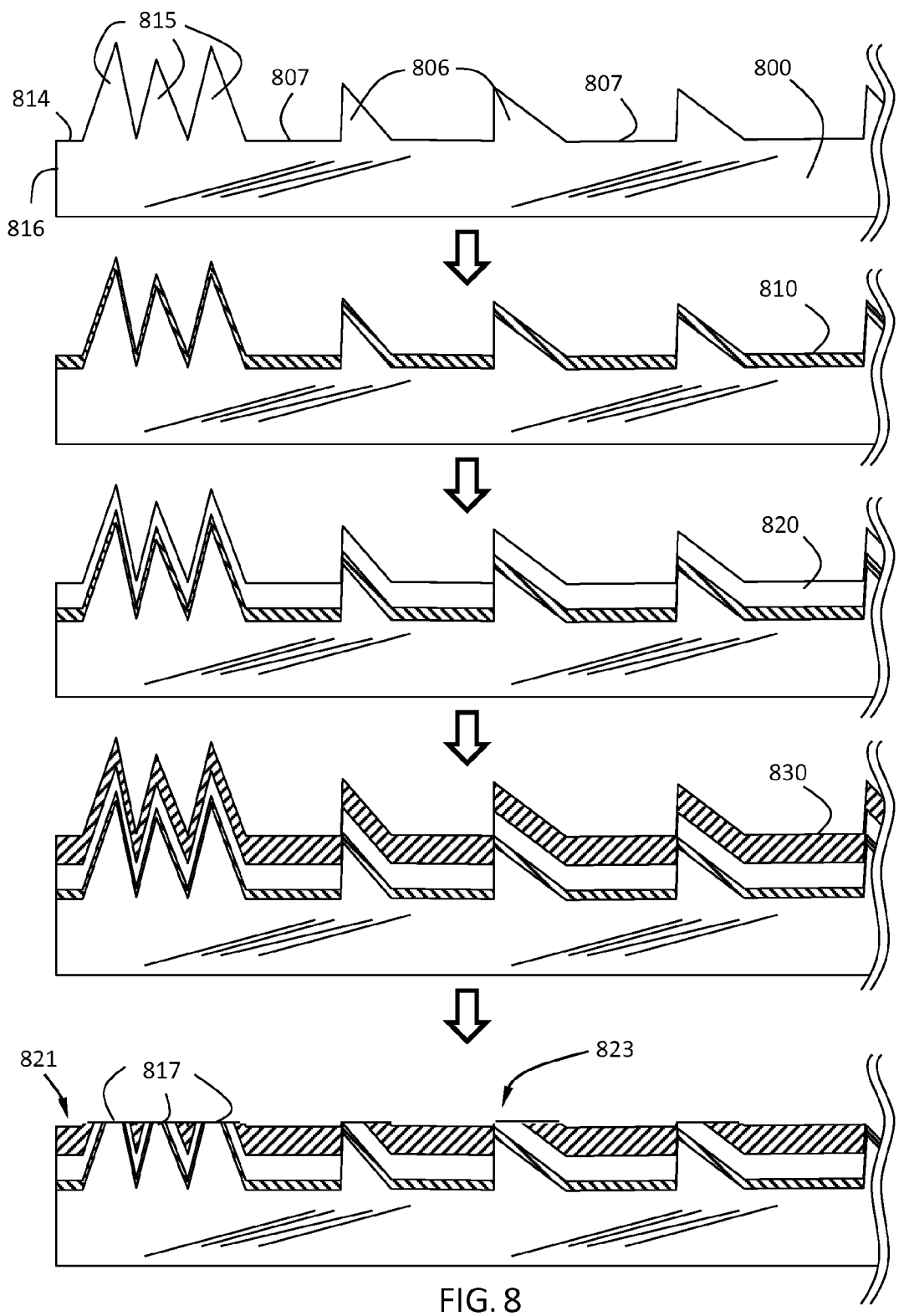
FIG. 8 shows a photovoltaic cell preparation using spaced ramps and topology changes in accordance with one or more embodiments of the invention.

FIG. 8 shows another embodiment of the invention which combines a plurality of peaks and a plurality of spaced ramps on the back side 214 of superstrate 800. In this embodiment, a plurality of peaks 815 is located near the left edge 816 of the superstrate 800. Only a left side of the photovoltaic module is shown and it should be understood that there may also be a plurality of peaks located near the right edge of the superstrate 800. A plurality of spaced ramps 806 are located throughout the central region of the superstrate 800. After depositing the front contact layer 810, the silicon layer 820 and the back contact layer 830, truncated peaks 817 can be created. This creates an edge region 821 which is electrically isolated from the central region 823. The use of multiple peaks 815 gives a greater degree of assurance that after truncation there will be at least one electrical discontinuity to create the isolated regions. As the height of the spaced ramps 806 is lower than the peaks 815, and as long as the truncation does not remove too much material, a central region 823 is created having a plurality of photovoltaic cells connected in series, with the back contact layer 830 of one cell in contact with the front contact layer 810 of an adjacent cell. In detailed embodiments, as shown in FIG. 8, the plurality of spaced ramps 806 are separated from each other to create a region of flat superstrate 807 between each ramp 806.

Figure 9:
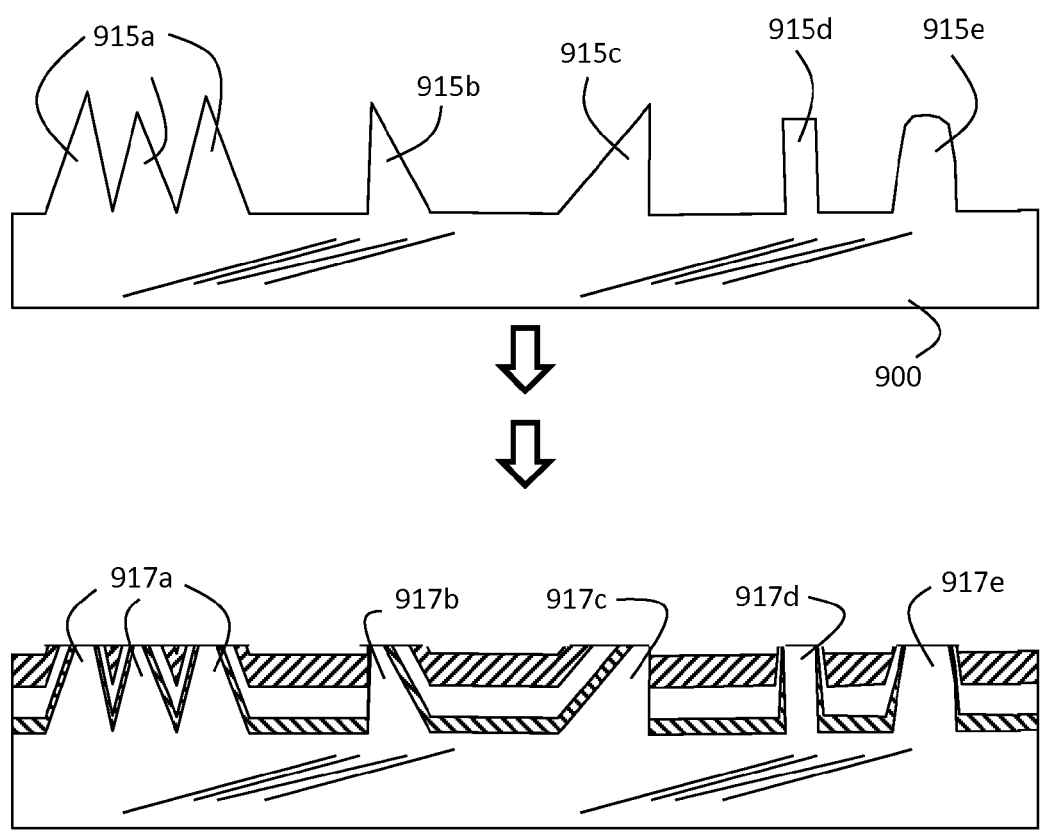
FIG. 9 shows a photovoltaic cell preparation using spaced ramps and topology changes in accordance with one or more embodiments of the invention.

FIG. 9 shows a variety of peaks 915a-d for use with one or more embodiments of the invention. The plurality of peaks 915a are similar to those shown in FIG. 8 and result in truncated peaks 917a where each of the plurality of peaks exposes a portion of the superstrate 900. Peak 915b and peak 915c are shaped similarly to the spaced ramps (not shown in FIG. 9). However, upon truncation, the truncated peak 917b and truncated peak 917c have a region of superstrate 900 exposed therethrough. Peak 915d has rectangular shape which becomes truncated peak 917d with an exposed superstrate 900 upon truncation. Peak 915e is a nonsymmetrical mound shape which becomes truncated peak 917e with an exposed superstrate 900 region upon truncation. The peak shapes shown in FIG. 9 are merely illustrative and should not be considered to limit the scope of the invention.

Reference throughout this specification to "one embodiment," "certain embodiments," "one or more embodiments," "an embodiment," "one aspect," "certain aspects," "one or more embodiments" and "an aspect" means that a particular feature, structure, material, or characteristic described in connection with the embodiment is included in at least one embodiment of the invention. Thus, the appearances of the phrases such as "in one or more embodiments," "in certain embodiments," "in one embodiment," "in an embodiment," "according to one or more aspects," "in an aspect," etc., in various places throughout this specification are not necessarily referring to the same embodiment or aspect of the invention. Furthermore, the particular features, structures, materials, or characteristics may be combined in any suitable manner in one or more embodiments or aspects. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A photovoltaic module comprising:
a superstrate having a front side, a back side, a left edge and a right edge, the back side having a roughened surface including at least one peak and a plurality of ramps, each ramp including a ramped surface and a vertical face which is perpendicular to the back side of the superstrate;
a front contact layer on the back side of the superstrate;
a layer of amorphous silicon overlying the front contact layer; and
a back contact layer overlying the silicon layer, the back contact layer having a front side facing the silicon layer and a back side,
wherein each ramp has an effective height to form a connection between the front contact layer located at a top of the ramp with the back contact layer located adjacent the top of the ramp on the vertical face that delimits the front contact layer, amorphous silicon layer and back contact layer into individual, electrically interconnected cells,
wherein the at least one peak and the layers thereon are truncated, exposing a portion of the superstrate relative to the front contact layer, amorphous silicon layer and back contact layer and interrupting electrical continuity of the photovoltaic module.

2. The photovoltaic module of claim 1, wherein the at least one peak is located near either the left edge or right edge of the superstrate.

3. The photovoltaic module of claim 1, wherein there is at least one peak located near the left edge of the superstrate and a plurality of peaks located near the right edge of the superstrate, each peak being truncated, exposing a portion of the superstrate.

4. The photovoltaic module of claim 3, wherein the at least one peak located near the left edge defines a left edge delete zone of the photovoltaic module, and the plurality of peaks located near the right edge defines a right edge delete zone of the photovoltaic module.

5. The photovoltaic module of claim 1, further comprising a reflective layer on the back contact layer, a polymer laminate layer on the reflective layer and a glass back on the polymer laminate layer.

6. The photovoltaic module of claim 1, wherein the plurality of ramps are separated by a distance in the range of about 5 mm to about 10 mm.

7. The photovoltaic module of claim 1, wherein the plurality of ramps extends outwardly from the back side of the superstrate to a height of about 5 microns.

8. The photovoltaic module of claim 1, wherein the superstrate is about 3 mm thick.

9. The photovoltaic module of claim 1, wherein the superstrate is glass.

10. The photovoltaic module of claim 1, wherein the superstrate is plastic.

* * * * *